United States Patent
Lee et al.

(10) Patent No.: US 8,594,967 B2
(45) Date of Patent: Nov. 26, 2013

(54) METHOD FOR MEASURING THE TEMPERATURE RISE INDUCED BY BIAS CURRENT/BIAS VOLTAGE IN A MAGNETIC TUNNEL JUNCTION

(75) Inventors: Mankit Lee, Hong Kong (CN);
Chiuming Lueng, Hong Kong (CN);
Cheukwing Leung, Hong Kong (CN);
Juren Ding, Hong Kong (CN);
Rongkwang Ni, Hong Kong (CN)

(73) Assignee: SAE Magnetics (H.K.) Ltd., Hong Kong (CN)

( * ) Notice: Subject to any disclaimer, the term of this patent is extended or adjusted under 35 U.S.C. 154(b) by 258 days.

(21) Appl. No.: 13/064,188

(22) Filed: Mar. 9, 2011

(65) Prior Publication Data

US 2012/0158349 A1 Jun. 21, 2012

(30) Foreign Application Priority Data

Dec. 15, 2010 (CN) .......................... 2010 1 0588666

(51) Int. Cl.
*G01K 7/00* (2006.01)
*G01K 7/36* (2006.01)

(52) U.S. Cl.
USPC .......................................... 702/130; 374/163

(58) Field of Classification Search
USPC .......... 324/210, 213, 219, 227, 244; 702/130, 702/85, 104, 116; 360/313–328; 374/163
See application file for complete search history.

(56) References Cited

U.S. PATENT DOCUMENTS

| | | | | |
|---|---|---|---|---|
| 5,978,163 | A * | 11/1999 | Cunningham | 360/66 |
| 6,751,039 | B1 * | 6/2004 | Cheng et al. | 360/66 |
| 7,417,442 | B2 * | 8/2008 | Hachisuka et al. | 324/691 |
| 7,667,456 | B2 * | 2/2010 | Naka | 324/210 |
| 7,815,369 | B2 * | 10/2010 | Antoku et al. | 374/163 |

* cited by examiner

*Primary Examiner* — Marc Armand
*Assistant Examiner* — Ricky Ngon
(74) *Attorney, Agent, or Firm* — Nixon & Vanderhye PC

(57) ABSTRACT

A method for measuring a temperature rise induced by bias current/bias voltage in a magnetic tunnel junction includes: (a) applying an external time-changing magnetic field to the magnetic tunnel junction; (b) measuring different first outer pin flip field values under different temperature values; (c) correlating the temperature values with the outer pin flip field values; (d) measuring different second outer pin flip field values under different bias current/bias voltage values; (e) correlating the different bias current/bias voltage-values with the measured different second outer pin flip field values; and (f) correlating temperature values and bias current/bias voltage values according to the results produced by (c) and (e). The method can determine what kind of TMR reader design provides more stable and reliable reading performance, especially under higher operational temperatures.

20 Claims, 13 Drawing Sheets

25degC

45degC

120degC

Delta Temperature Vs Delta OP Flip field

METHOD FOR MEASURING THE TEMPERATURE RISE INDUCED BY BIAS CURRENT/BIAS VOLTAGE IN A MAGNETIC TUNNEL JUNCTION

This application claims the benefit of Chinese Patent Application No. 201010588666.5, filed 15 Dec. 2010, the entire contents of which is hereby reference in this application.

FIELD OF THE INVENTION

The present inventions relates to methods for testing the performance of a magnetic head, and more particularly to a method for measuring the temperature rise induced by bias current/bias voltage in a magnetic tunnel junction (MTJ).

BACKGROUND OF THE INVENTION

Hard disk drive incorporating rotating magnetic disks is commonly used for storing data in the magnetic media formed on the disk surfaces, and a movable slider including read sensors are generally used to read data from tracks on the disk surfaces.

Presently, magnetoresistive (MR) read sensor, commonly referred to as MR sensor, is the prevailing read sensor because of its better capability to read data from a surface of a disk at greater track and linear densities than thin film inductive heads. An MR sensor detects a magnetic field through the change in the resistance of its MR sensing layer (also referred to as an "MR element") as a function of the strength and direction of the magnetic flux being sensed by the MR layer.

Now, several types of MR sensors have been widely used by disk drive manufacturers in succession. One is anisotropic magnetoresistive (AMR) sensor, which makes the angle between the magnetization direction and the direction of sense current flowing through the MR element change and, in turn, cause a change the resistance of the MR element and a corresponding change in the sensed current or voltage. Another type is giant magnetoresistive (GMR) sensor manifesting the GMR effect. The GMR effect is a phenomenon that the magnetoresistive ratio (MRR) will change under an external time-changing magnetic field. The GMR sensor includes two ferromagnetic layers and a non-ferromagnetic layer sandwiched between the two ferromagnetic layers. The resistance of the non-ferromagnetic layers varies with the magnetic moments of the ferromagnetic layers, the conduction electrons and the spin-dependent scattering. Still another type of MR sensor is tunnel magnetoresistive (TMR) sensor, which includes a magnetic tunnel junction (MTJ) where the tunneling magneto-resistance effect (TMR effect) occurs. The TMR sensor has become the mainstream MR sensor due to its more remarkable change of MRR by replacing AMR sensor and GMR sensor.

However, high temperature noise (HTN) problems always exist in the above-mentioned MR sensors and influence their working performance seriously. As well known, higher bias current/bias voltage is needed to provide better performance of the MR sensor, but higher bias current/bias voltage applied will bring higher temperature rise, in turn, induce high temperature noise. Thus, it is necessary to seek a balance between the temperature and the bias current/bias voltage according to the correlation between the temperature and the bias current/bias voltage.

To solve above difficult problem, for a GMR sensor, a method for measuring the temperature rise induced by bias current/bias voltage is performed. Since the whole GMR sensor is made of metal, the temperature rise can be estimated by using conductor's method. However, the TMR sensor does not belong to conductor, above-mentioned conductor's method can not be implemented for a TMR sensor so as to measuring the temperature rise in its magnetic tunnel junction (MTJ).

Hence, it is desired to provide a method for measuring the temperature rise induced by bias current/bias voltage in a magnetic tunnel junction (MTJ).

SUMMARY OF THE INVENTION

One objective of the present invention is to provide a method for measuring the temperature rise induced by bias current/bias voltage in a magnetic tunnel junction of a tunnel magnetoresistive sensor; thereby it can be determined what kind of reader design can provide more stable and reliable reading performance especially under higher operational temperature.

To achieve above objectives, the present invention provides method for measuring the temperature rise induced by bias current/bias voltage in a magnetic tunnel junction, the method including the steps of: (a) applying an external time-changing magnetic field to the magnetic tunnel junction; (b) measuring different first outer pin flip field values under different temperature values; (c) calculating the correlation between the temperature and the outer pin flip field according to the temperature values and the first outer pin flip field values; (d) measuring different second outer pin flip field values under different bias current/bias voltage values; (e) calculating the correlation between the bias current/bias voltage and the outer pin flip field according to the bias current/bias voltage values and the second outer pin flip field values; (f) calculating the correlation between the temperature and the bias current/bias voltage according to the results produced by the step (c) and step (e).

Preferably, the step (b) includes the steps of: (b1) measuring different magneto-resistance ratio responds of the magnetic tunnel junction to form different first curves under different temperature values; (b2) measuring each first outer pin flip field value from each first curve.

Preferably, the step (c) includes the steps of: (c1) calculating a plurality of delta temperature values according to the different temperature values; (c2) calculating a plurality of delta first outer pin flip field values according to the different first outer pin flip field values; (c3) calculating the correlation between the delta temperature values and the delta first outer pin flip field values to form a first equation.

Preferably, the step (d) includes the steps of: (d1) measuring different magneto-resistance ratio responds of the magnetic tunnel junction to form different second curves under different bias current/bias voltage values; (d2) measuring each second outer pin flip field value from each second curve.

Preferably, the step (e) includes the steps of: (e1) calculating a plurality of delta bias current/bias voltage values according to the different bias current/bias voltage values; (e2) calculating a plurality of delta second outer pin flip field values according to the different second outer pin flip field values; (e3) calculating the correlation between the delta bias current/bias voltage values and the delta second outer pin flip field values to form a second equation.

Preferably, the step (b) is implemented under minimum applied bias voltage whose value is 40 mV.

Preferably, the step (d) is implemented under room temperature.

Preferably, wherein the different temperature values are supplied by a close loop environmental chamber.

In comparison with the prior art, the present invention provides a method for measuring the temperature rise induced by bias current/bias voltage in a magnetic tunnel junction of a tunnel magnetoresistive (TMR) sensor, thereby it can be determined what kind of TMR reader design can provide more stable and reliable reading performance especially under higher operational temperature.

Other aspects, features, and advantages of this invention will become apparent from the following detailed description when taken in conjunction with the accompanying drawings, which are a part of this disclosure and which illustrate, by way of example, principles of this invention.

BRIEF DESCRIPTION OF THE DRAWINGS

The accompanying drawings facilitate an understanding of the various embodiments of this invention. In such drawings.

DETAILED DESCRIPTION OF ILLUSTRATED EMBODIMENTS

Figure 1:
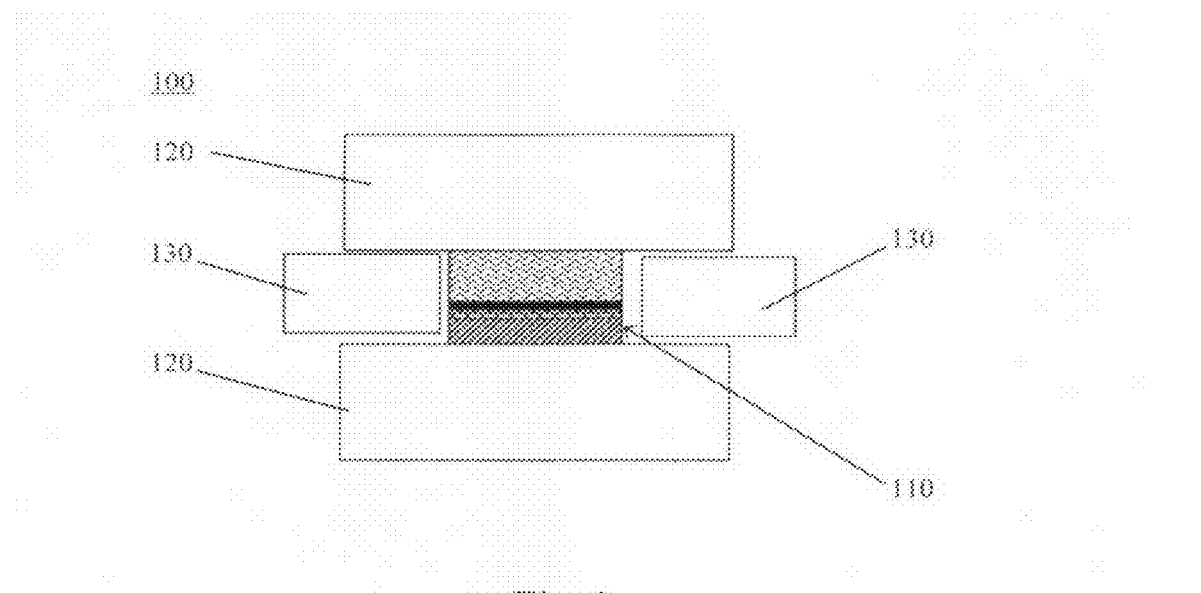
FIG. 1 is a schematic diagram illustrating a structure of a conventional TMR sensor.

Various preferred embodiments of the invention will now be described with reference to the figures, wherein like reference numerals designate similar parts throughout the various views. As indicated above, the invention is directed to a method for measuring the temperature rise induced by bias current/bias voltage in a magnetic tunnel junction. The method includes the steps of: (a) applying an external time-changing magnetic field to the magnetic tunnel junction; (b) measuring different first outer pin flip field values under different temperature values; (c) calculating the correlation between the temperature and the outer pin flip field according to the temperature values and the first outer pin flip field values; (d) measuring different second outer pin flip field values under different bias current/bias voltage values; (e) calculating the correlation between the bias current/bias voltage and the outer pin flip field according to the bias current/bias voltage values and the second outer pin flip field values; (f) calculating the correlation between the temperature and the bias current/bias voltage according to the results produced by the step (c) and step (e). According to above method, the correlation between the temperature and the bias current/bias voltage can be obtained; thereby it can be determined what kind of reader design provides more stable and reliable reading performance under higher operational temperature.

Figure 2:
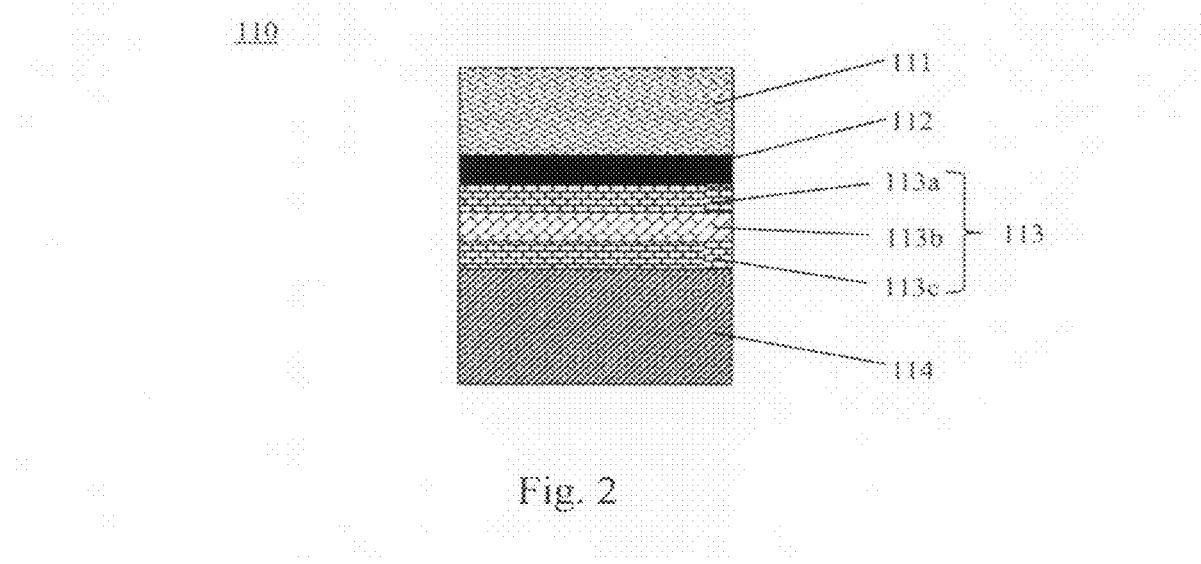
FIG. 2 is a schematic diagram illustrating a MTJ structure of the TMR sensor shown in FIG. 1.

FIG. 1 shows a TMR sensor and FIG. 2 shows a MTJ of the TMR sensor. As illustrated in FIG. 1 and FIG. 2, the TMR sensor 100 includes a magnetic tunnel junction (MTJ) 110 where the tunneling magneto-resistance effect (TMR effect, which denotes the resistance change by external time-changing magnetic field) occurs. The MTJ 110 includes a free layer 111, a barrier layer 112, a pinned layer 113 and a pinning layer 114, all of which are sandwiched between two shields 120 and two hard magnets 130. Concretely, the pinned layer 113 includes an inner pin layer 113a, an outer pin layer 113c, and a ru layer 113b which is sandwiched between the inner layer 113a and the outer layer 113c. Since the pinning layer 114 is made of anti-ferromagnetic material, it always is called antiferromagnetic (AFM) layer 114.

Figure 3:
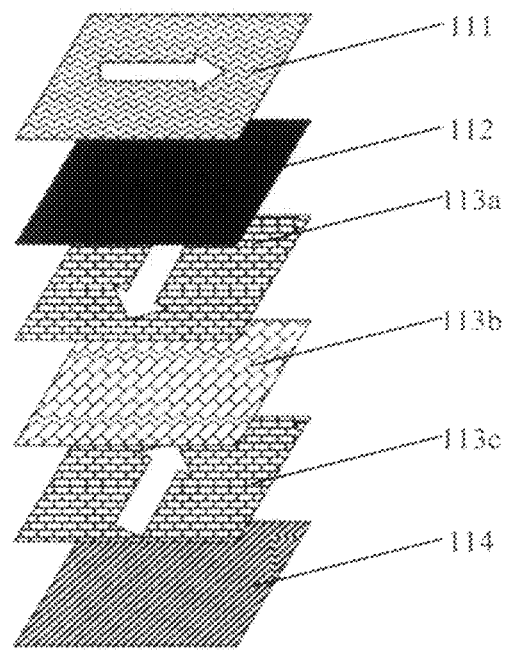
FIG. 3 shows the magnetization direction of each layer of the MTJ shown in FIG. 2.
Figure 4:
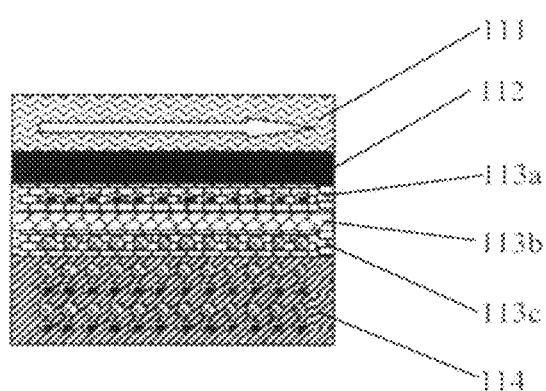
FIG. 4 shows the major coupling within the MTJ shown in FIG. 2.

As shown in FIG. 3 and FIG. 4, in general, the magnetization of the free layer 111 is controlled by the hard magnet 130; the inner pin layer 113a is controlled by the outer pin layer 113c; while the outer pin layer 113c is controlled by the AFM layer 114. Thus, there are two major coupling formed in the MTJ 110. One is exchange coupling, which is a coupling between the AFM layer 114 and the outer pin layer 113c. The other one is synthetic coupling, which is a coupling between the inner pin layerc 113a and the outer pin layer 113c.

Figure 5:
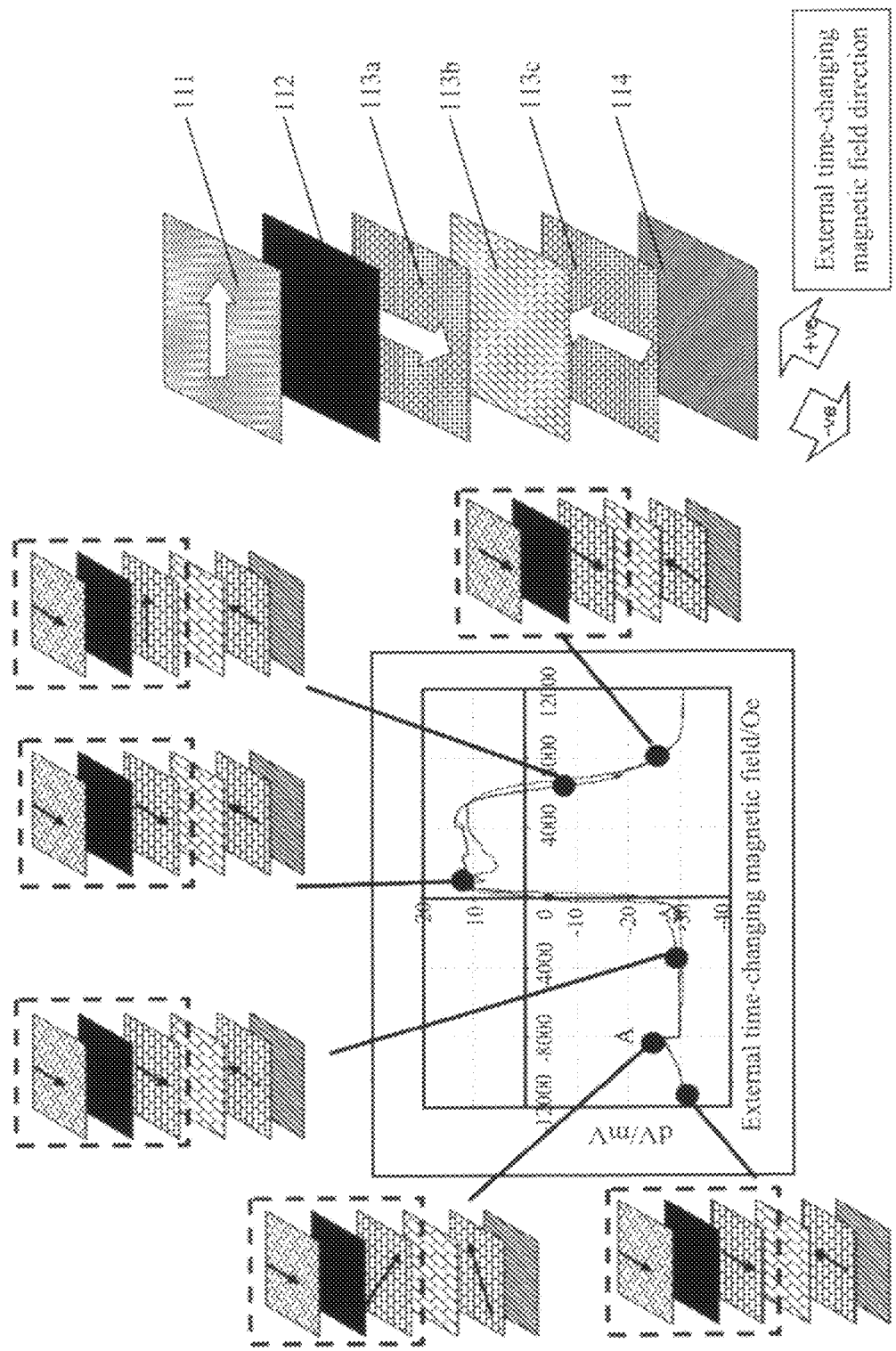
FIG. 5 is a HFQST Curve formed by measuring the MRR respond of the TMR sensor under a high external time-changing magnetic field.

When the TMR sensor 100 is disposed in an external time-changing magnetic field, a TMR effect occurs and the Magnetoresistive Ratio (MRR) respond of the TMR sensor can be measured by a High Field Quasi-Static Test (HFQST) Curve as shown in FIG. 5. Now, referring to FIG. 5, the magnetoresistive ratio (MRR) of the MTJ 110 is changed by changing the magnetization angle between the free layer 111 and the inner pin layer 113a of the pinned layer 113. Lower MRR is observed when the magnetization angle between the free layer 111 and the inner pin layer 113a is zero (parallel state), while, higher MRR is found when the magnetization angle between the free layer 111 and the inner pin layer 113a is 180 deg (Anti-parallel state). When the external time-changing magnetic field is strong enough, it will break the exchange coupling between the AFM layer 114 and outer pin layer 113c, and the external time-changing magnetic field will force the outer pin layer 113c to follow its magnetization direction. However, since the synthetic coupling between the inner pin layerc 113a and the outer pin layer 113c still exists, the magnetization direction of the inner pin layer 113a will also move a little bit and that makes a special respond which is called outer pin flip, shown as point A in FIG. 5. In order to describe the characteristic of above phenomenon expediently, outer pin flip field is introduced, whose value is equal to the external time-changing magnetic field strength when the outer pin flip (OP Flip) occurred. Outer pin flip field is mainly depended on exchange coupling which is highly sensitive on temperature, but independent on MRR, thus, outer pin flip field may be a good parameter for temperature rise measurement. Based on aforementioned technique, the method of the present invention utilizes outer pin flip field to measure the temperature rise induced by bias current/bias voltage.

Figure 6:
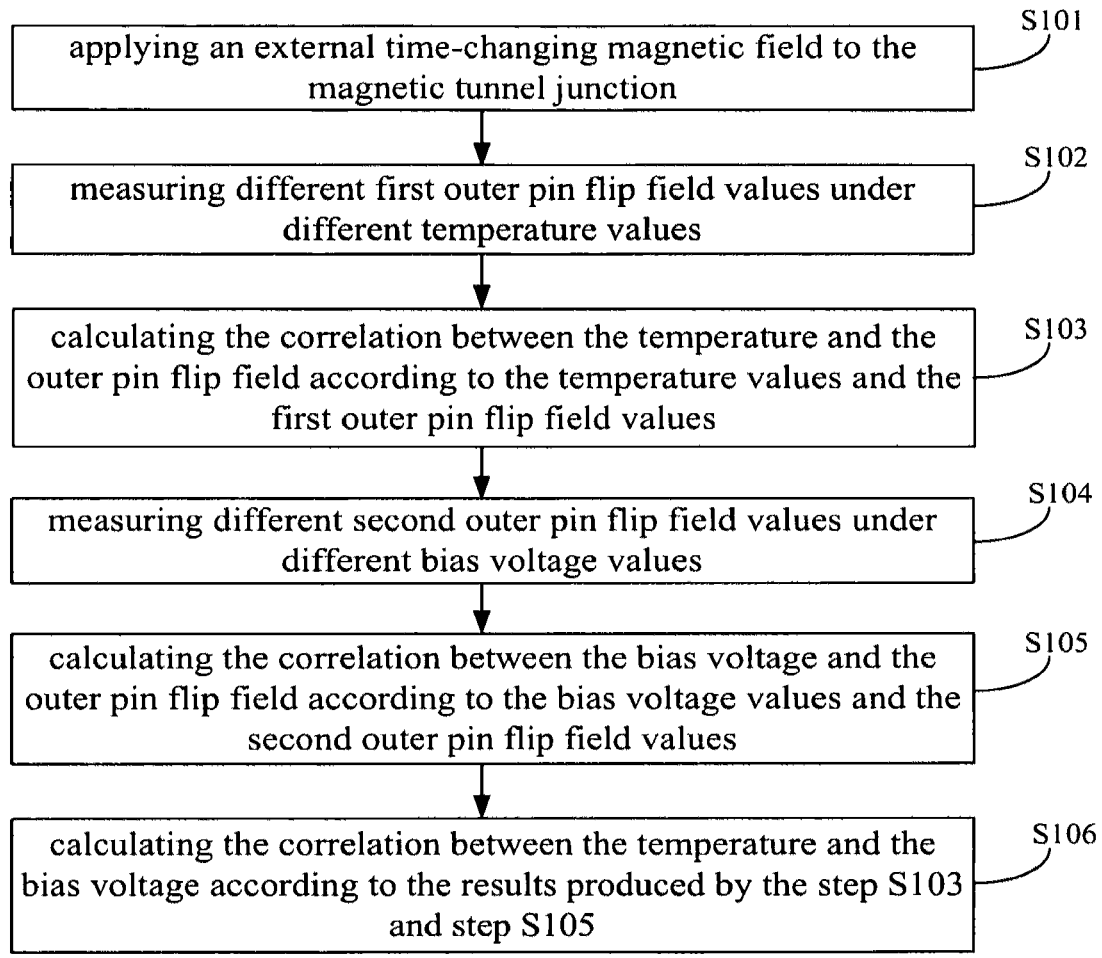
FIG. 6 is flowchart showing a method for measuring the temperature rise induced by bias voltage in the MTJ shown in FIG. 2 according to an embodiment of the present invention.

Now, referring to FIG. 6, according to an embodiment of the present invention, the method for measuring the temperature rise induced by bias voltage includes the steps as follows: applying an external time-changing magnetic field to the magnetic tunnel junction (MTJ) (step S101); measuring different first outer pin flip field values under different temperature values (step S102); calculating the correlation between the temperature and the outer pin flip field according to the temperature values and the first outer pin flip field values (step S103); measuring different second outer pin flip field values under different bias voltage values (step S104); calculating the correlation between the bias voltage and the outer pin flip field according to the bias voltage values and the second outer pin flip field values (step S105); calculating the correlation between the temperature and the bias voltage according to the results produced by the step S103 and step S105 (step S106). In another embodiment of the present invention, the step S104 and step S105 are implemented before the step S102 and step S103.

Figure 7:
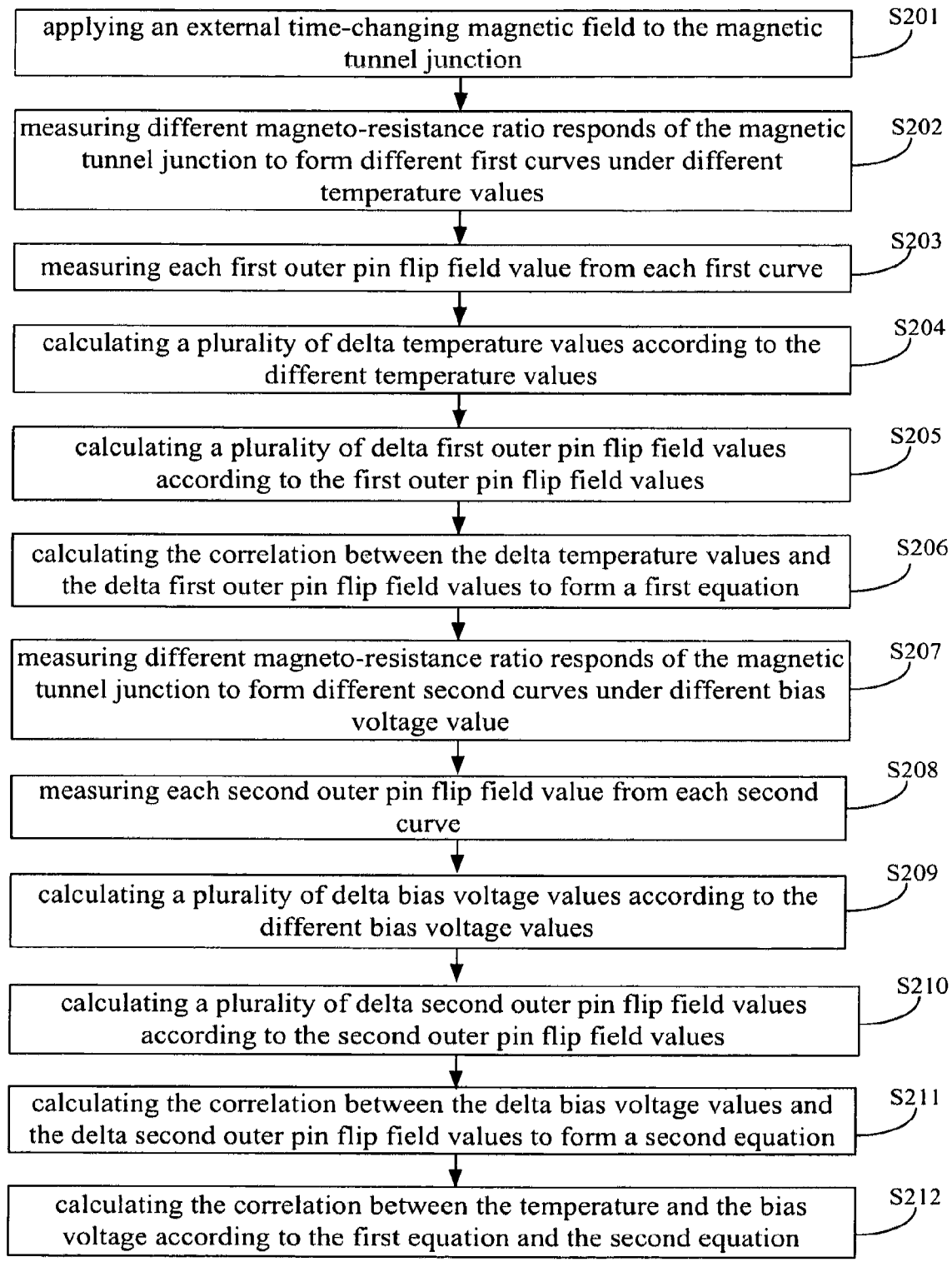
FIG. 7 is another flowchart showing a method for measuring the temperature rise induced by bias voltage in the MTJ shown in FIG. 2 according to another embodiment of the present invention.

As shown in FIG. 7, according to a preferable embodiment of the present invention, the method for measuring the temperature rise induced by bias voltage includes the steps as follows:

First, applying an external time-changing magnetic field to the magnetic tunnel junction (step S201), preferably, this step is implemented by disposing the magnetic tunnel junction sensor in an external time-changing magnetic field which is produced by an electromagnet.

Figure 8A:
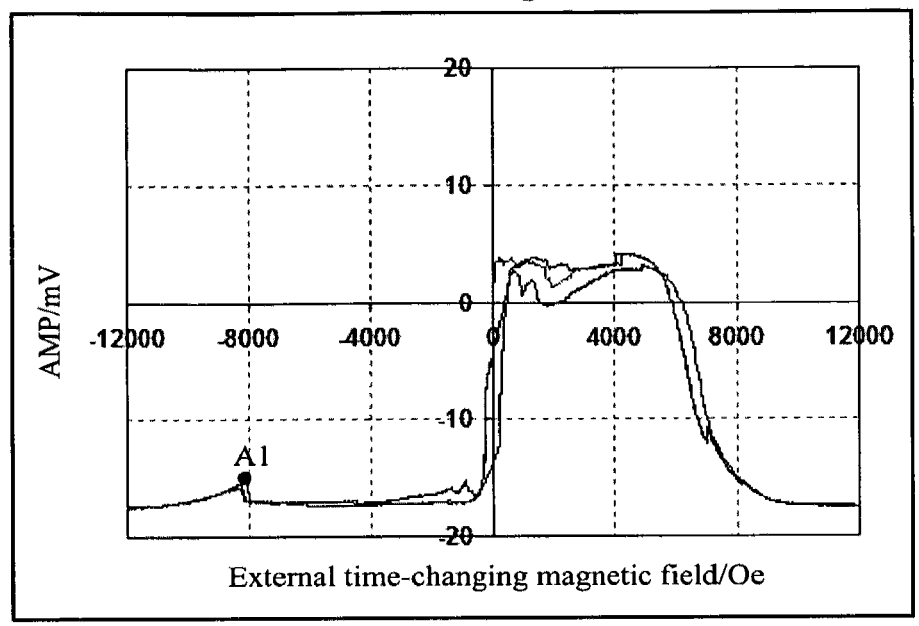
FIGS. 8a-8g are graphs illustrating different HFQST Curves formed under different temperature.
Figure 8B:
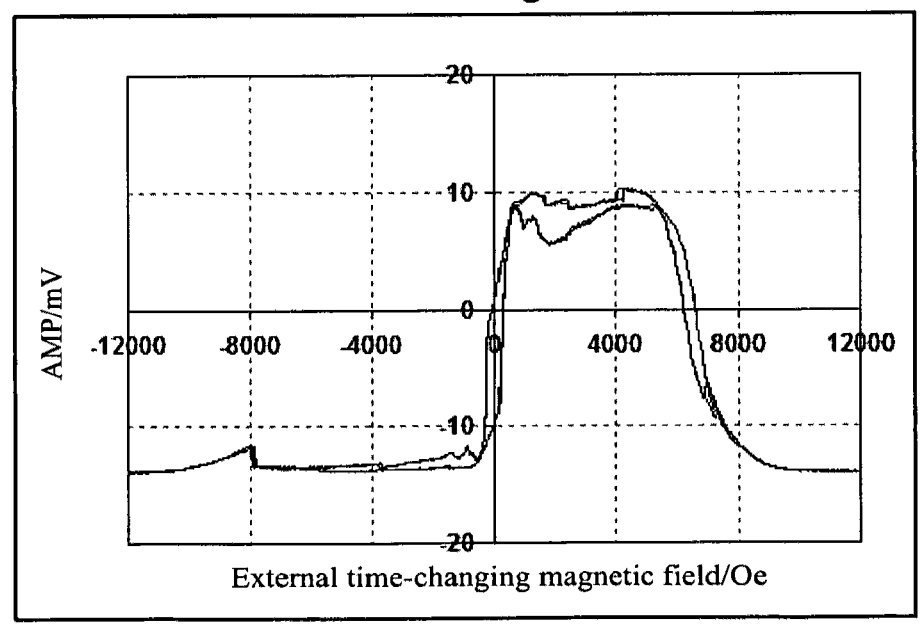
Figure 8C:
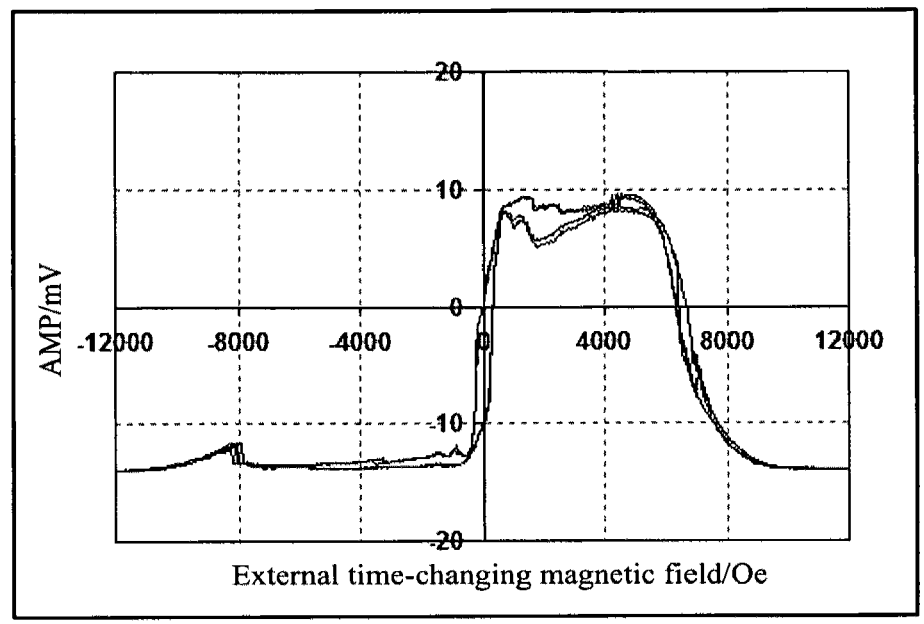
Figure 8D:
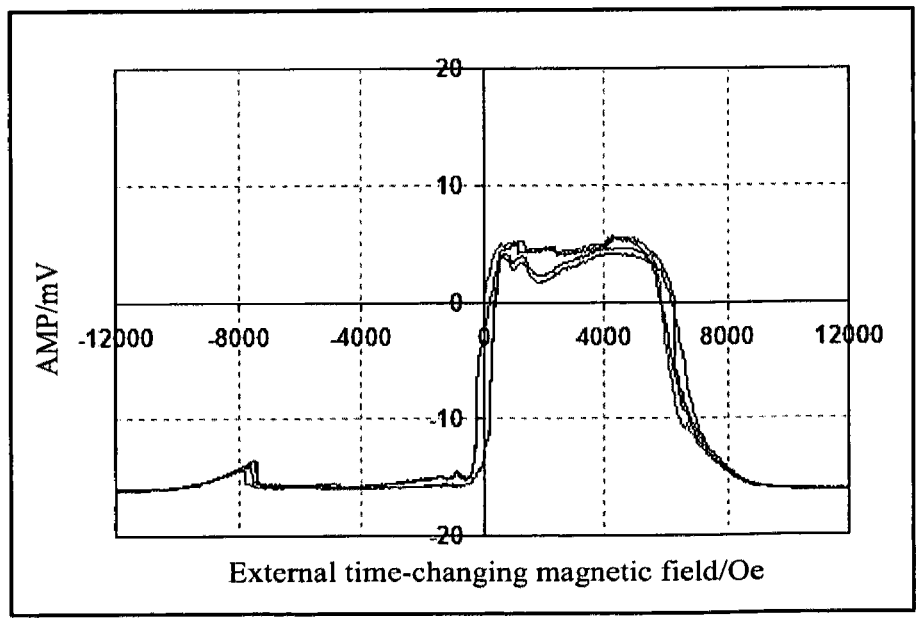
Figure 8E:
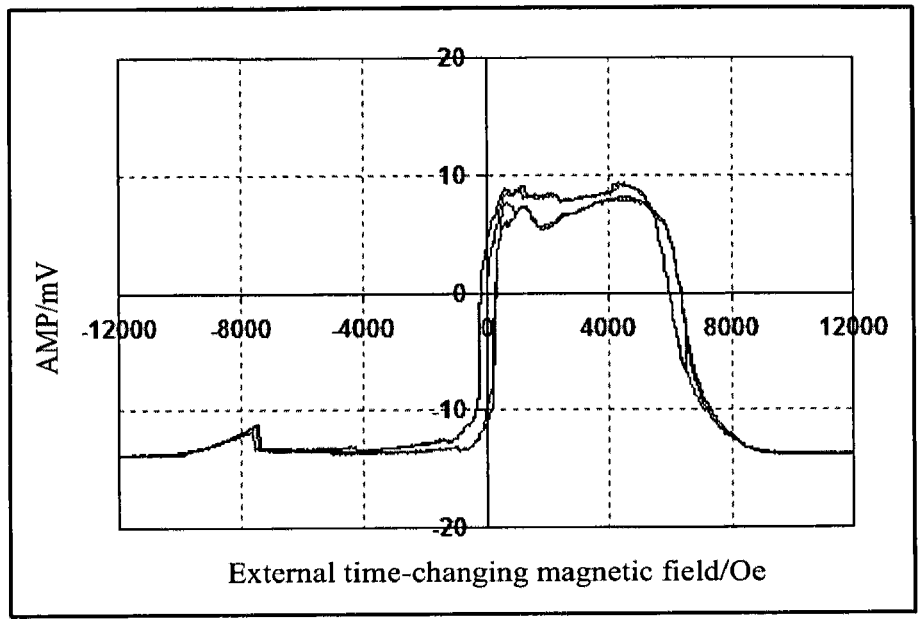
Figure 8F:
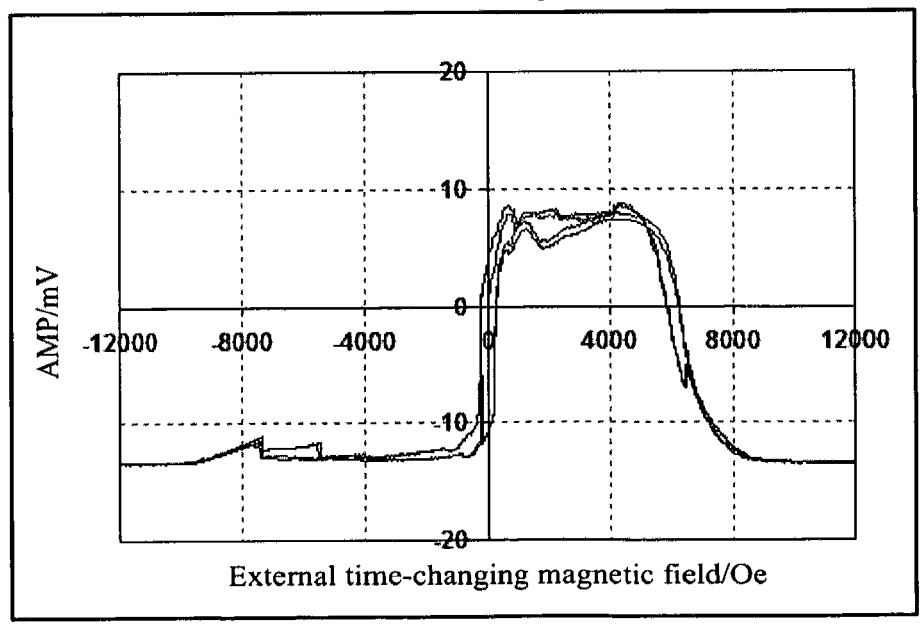
Figure 8G:
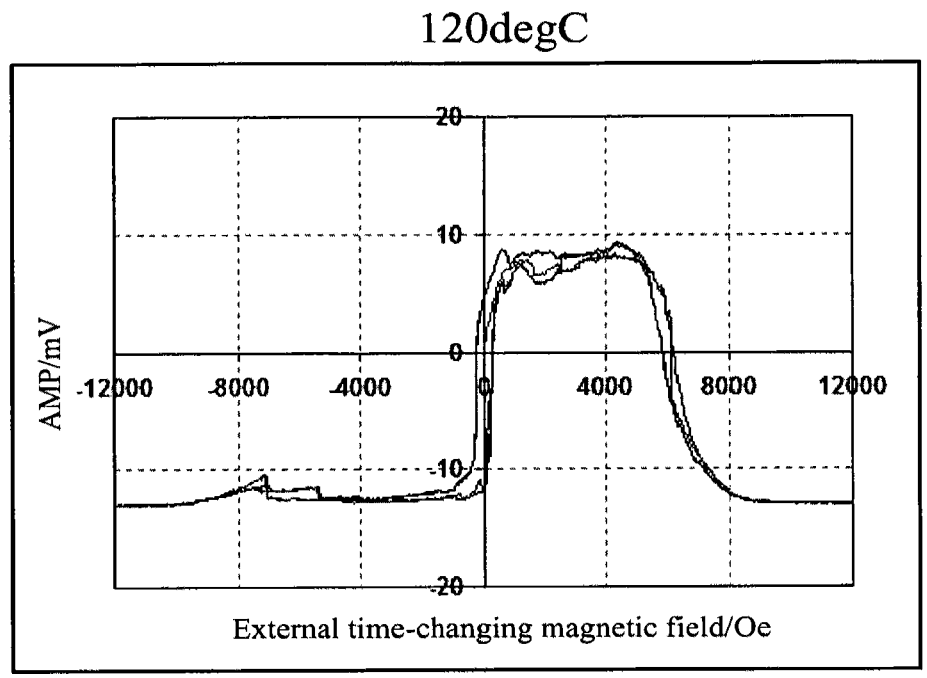

Next, measuring different magneto-resistance ratio responds of the magnetic tunnel junction to form different first curves under different temperature values (step S202). Preferably, this step is implemented under minimum applied bias voltage whose value is 40 mV, and the different temperature values (in this embodiment, seven different temperature values are provided, such as 25 deg C., 45 deg C., 60 deg C. and so on) are supplied by a close loop environmental chamber. Referring to FIG. 8a-8g, after the step S202 being implemented, seven first curves (all are HFQST Curves) are obtained to show the magneto-resistance ratio responds of the magnetic tunnel junction under seven different temperature values, respectively. Then, a next step can be implemented: measuring each first outer pin flip field value from each first curve (step S203). As shown in FIG. 8a, when the temperature value is 25 deg C., the outer pin flip occurred at point A1, from this curve, a first value of the outer pin flip field can be calculated. Similarly, referring to FIG. 8b-8g, the other first values of the outer pin flip field also can be calculated by the same ways. In this embodiment, because there are seven temperature values provided, seven first outer pin flip field values can be obtained.

Figure 9:
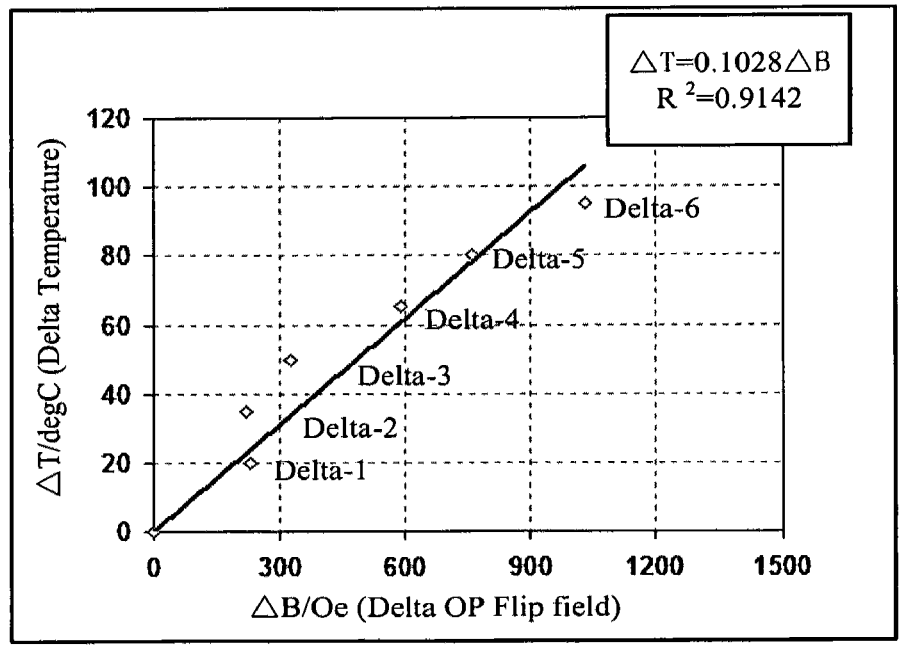
FIG. 9 is a graph showing the correlation between the temperature and the outer pin flip field.

Based on above data, the next three steps can be implemented: calculating a plurality of delta temperature values according to the different temperature values (step S204); calculating a plurality of delta first outer pin flip field values according to the first outer pin flip field values (step S205); calculating the correlation between the delta temperature values and the delta first outer pin flip field values to form a first equation (step S206). Concretely, referring to FIG. 8a and FIG. 8b, when the temperature value rises from 25 deg C. to 45 deg C., a delta temperature value is calculated to be 20 deg C., and a delta first outer pin flip field value is calculated to be about 231 Oe, thus, a first set of data Delta-1 (20 deg C., 231 Oe) about the delta temperature value and the delta first outer pin flip field values is obtained. Similarly, referring to FIG. 8a and FIG. 8c, when the temperature value is changed to be 60 deg C., another delta temperature value is calculated to be 35 deg C., and another delta first outer pin flip field value is calculated to be about 222 Oe, thus, a second set of data Delta-2 (35 deg C., 222 Oe) is obtained. By this means, other four sets of data about the delta temperature value and the delta first outer pin flip field values, which are Delta-3, Delta-4, Delta-5 and Delta-6, also can be obtained. As shown in FIG. 9, according to above six sets of data, the correlation between the delta temperature values and the delta first outer pin flip field values can be calculated to form a first equation: $\Delta T=0.102\Delta B$ (wherein, the parameter $\Delta B$ denotes the change of outer pin flip field, while the parameter $\Delta T$ denotes the change of temperature).

Figure 10A:
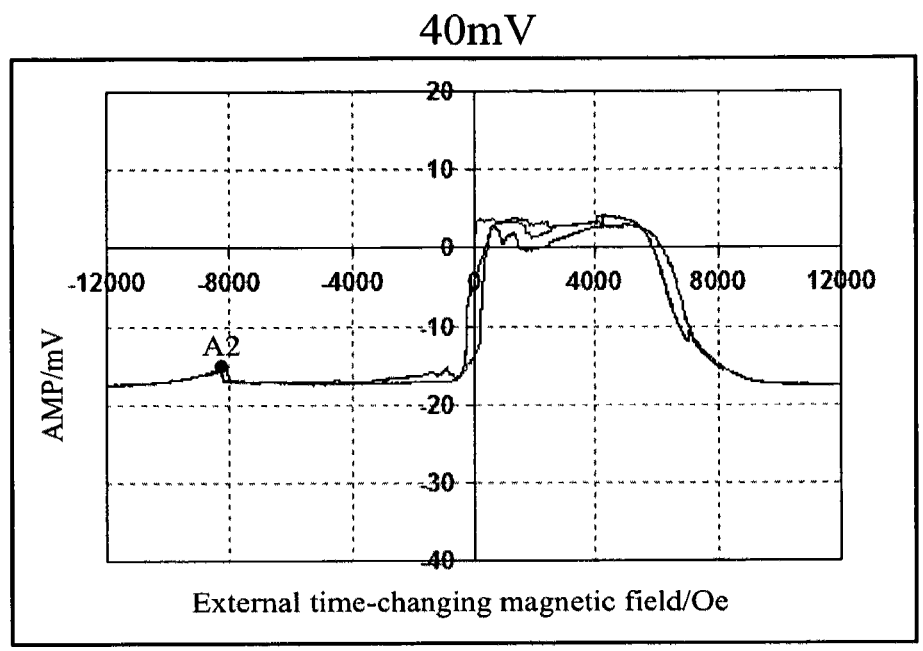
FIGS. 10a-10e are graphs illustrating different HFQST Curves formed under different bias voltage.
Figure 10B:
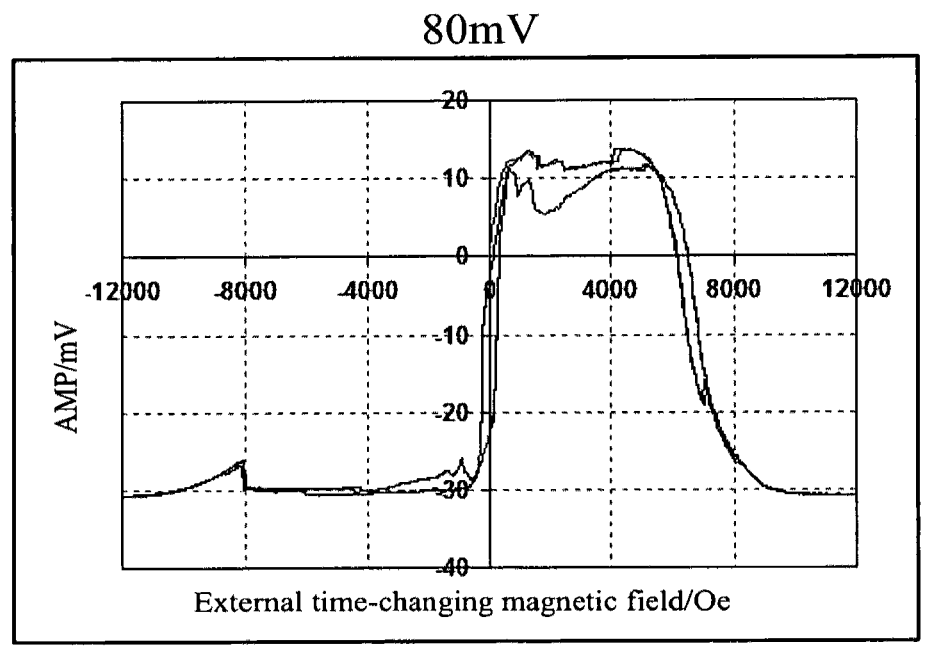
Figure 10C:
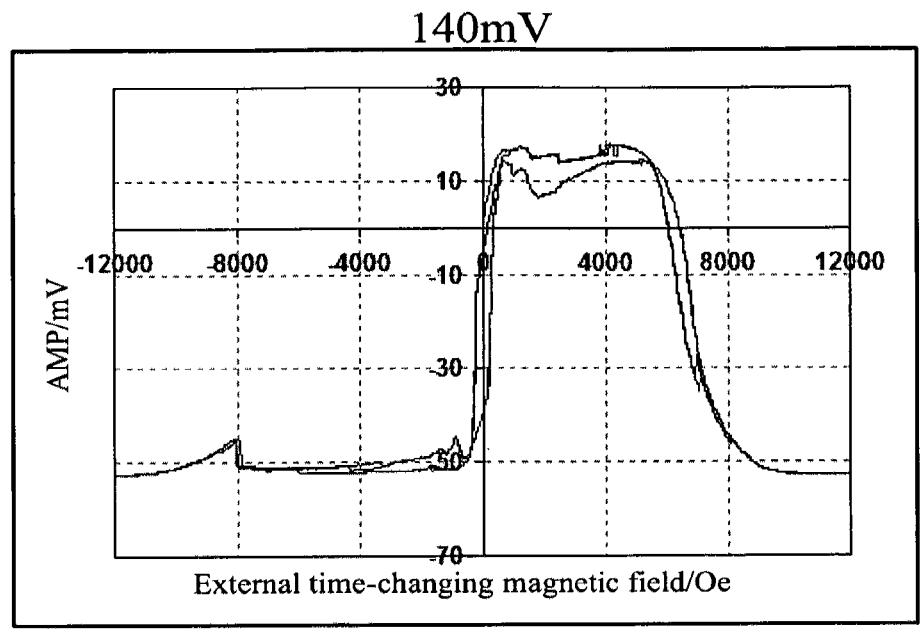
Figure 10D:
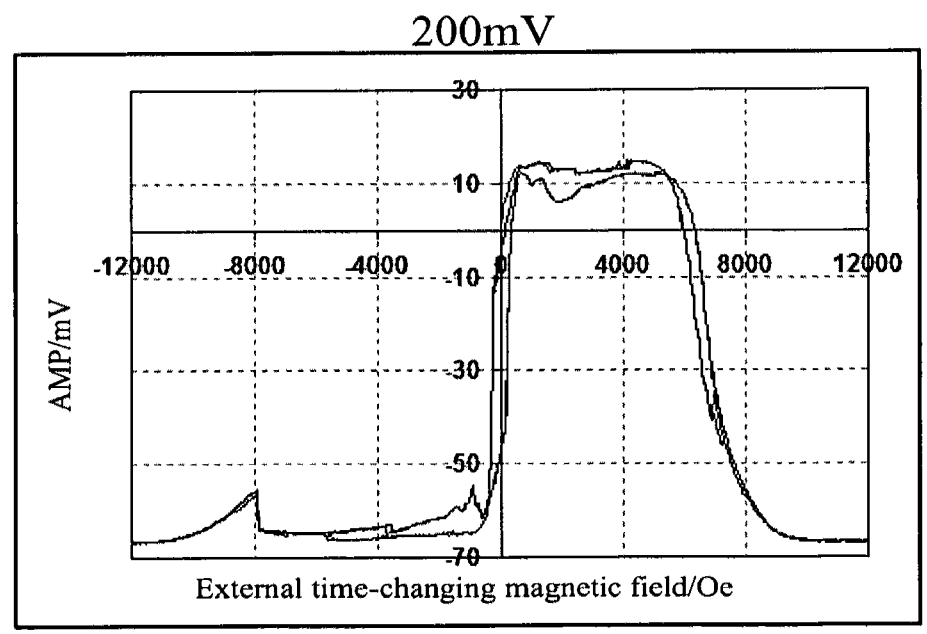
Figure 10E:
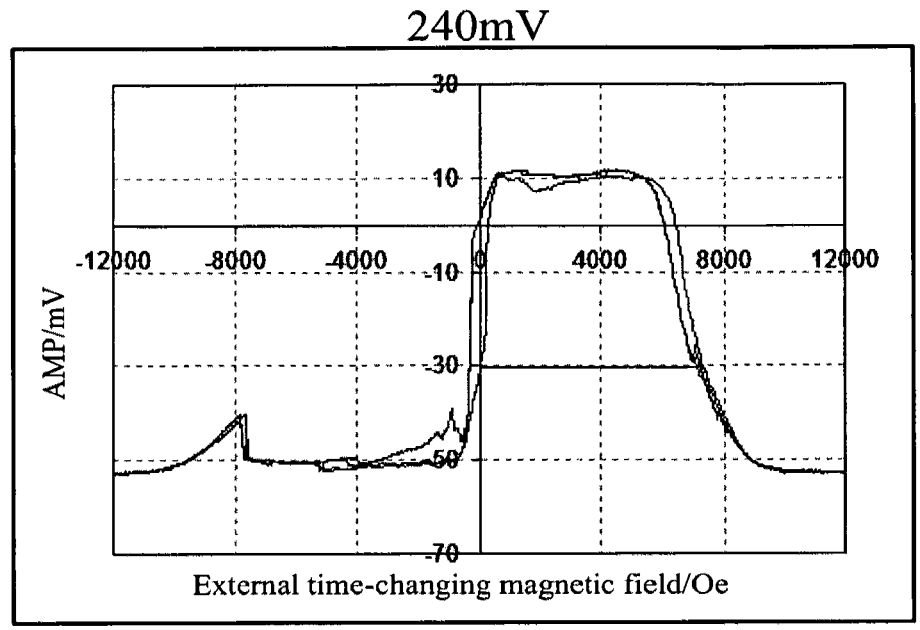

Similarly, the correlation between the bias voltage and the outer pin flip field can be obtained in the same way. Concretely, it includes the following steps: measuring different magneto-resistance ratio responds of the magnetic tunnel junction to form different second curves under different bias voltage value (step S207). Preferably, this step is implemented under room temperature. In this embodiment, five different bias voltage values are provided, such as 40 mV, 80 mV, 140 mV and so on. Referring to FIG. 10a-10e, after the step 207 being implemented, five second curves (all are HFQST Curves) are obtained to show the magneto-resistance ratio responds of the magnetic tunnel junction under five different bias voltage values, respectively. Then, a next step can be implemented: measuring each second outer pin flip field value from each second curve (step S208). As shown in FIG. 10a, when the bias voltage value is 40 mV, the outer pin flip occurred at point A2, from this curve, a second value of the outer pin flip field can be calculated. Similarly, referring to FIG. 10b-10e, the other second values of the outer pin flip field also can be calculated by the same ways. In this embodiment, because there are five bias voltage values provided, five second outer pin flip field values can be obtained.

Figure 11:
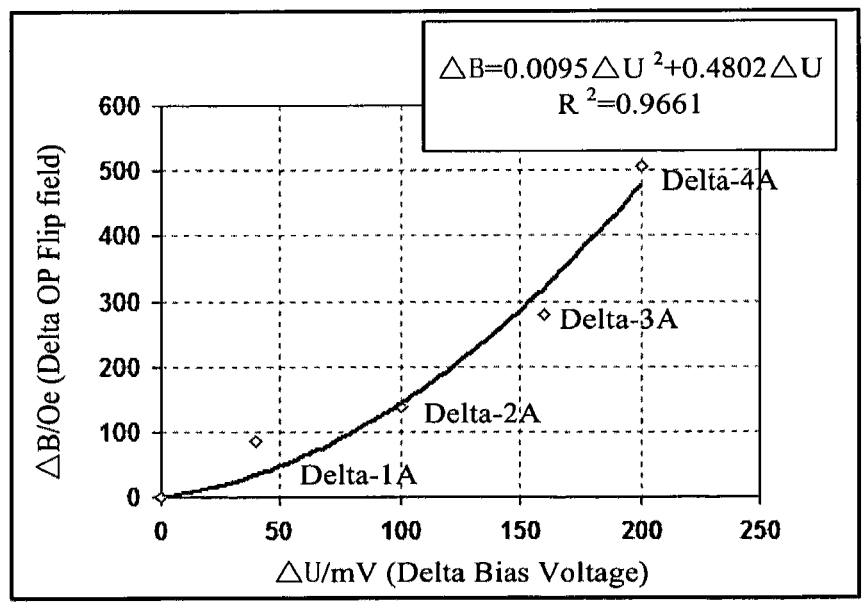
FIG. 11 is a graph showing the correlation between the bias voltage and the outer pin flip field.
Figure 12:
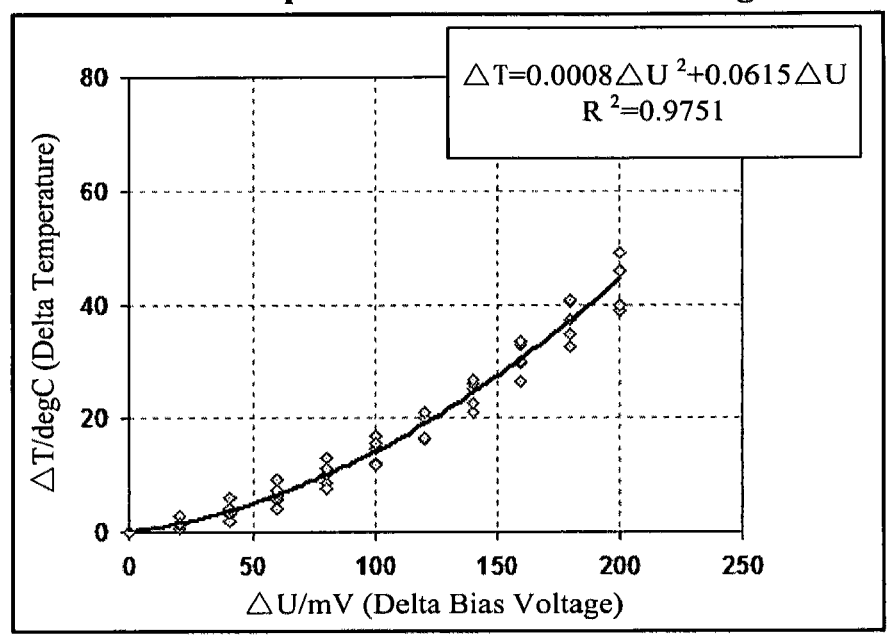
FIG. 12 is another graph showing the correlation between the temperature and the bias voltage.

Based on above data, the next three steps can be implemented: calculating a plurality of delta bias voltage values according to the different bias voltage values (step S209); calculating a plurality of delta second outer pin flip field values according to the second outer pin flip field values (step S210); calculating the correlation between the delta bias voltage values and the delta second outer pin flip field values to form a second equation (step S211). Concretely, by the means as that of steps S204, S205 and S206, four sets of data about the delta bias voltage value and the delta second outer pin flip field values, which are Delta-1A, Delta-2A, Delta-3A and Delta-4A, can be obtained. As shown in FIG. 11, according to above four sets of data, the correlation between the delta bias voltage values and the delta second outer pin flip field values can be calculated to form a second equation: $\Delta B=0.0095\Delta U^2+0.4802\Delta U$ (wherein, the parameter $\Delta B$ denotes the change of outer pin flip field, while the parameter $\Delta U$ denotes the change of bias voltage).

Finally, calculating the correlation between the temperature and the bias voltage according to the first equation and the second equation (step S212). The result obtained by implementing the step S212 is a third equation: $\Delta T=0.0008\Delta U^2+0.0615\Delta U$ (wherein, the parameter $\Delta T$ denotes the change of temperature, while the parameter $\Delta U$ denotes the change of bias voltage). From this equation, temperature rise induced by bias voltage can be calculated.

It should be noted that the operation order of the steps S202 to S211 is not to be limited to the disclosed embodiment, while it can be changed according to the actual need.

Understandably, according to the aforementioned embodiment, a method for measuring the temperature rise induced by bias current can be implemented by replacing bias voltage with bias current.

While the invention has been described in connection with what are presently considered to be the most practical and preferred embodiments, it is to be understood that the invention is not to be limited to the disclosed embodiments, but on the contrary, is intended to cover various modifications and equivalent arrangements included within the spirit and scope of the invention.

What is claimed is:

1. A method for measuring a temperature rise induced by bias current/bias voltage in a magnetic tunnel junction, the method comprising:
   (a) applying an external time-changing magnetic field to the magnetic tunnel junction;
   (b) measuring different first outer pin flip field values under different temperature values;
   (c1) calculating a plurality of delta temperature values according to the different temperature values;
   (c2) calculating a plurality of delta first outer pin flip field values according to the different first outer pin flip field values;
   (c3) correlating the delta temperature values with the delta first outer pin flip field values to form a first equation;
   (d) measuring different second outer pin flip field values under different bias current/bias voltage values;
   (e) correlating the different bias current/bias voltage values with the measured different second outer pin flip field values; and
   (f) correlating temperature values and bias current/bias voltage values according to the results produced by (c3) and (e).

2. The method as claimed in claim 1, wherein (b) comprises:
   (b1) measuring different magneto-resistance ratio responds of the magnetic tunnel junction to form different first curves under different temperature values; and
   (b2) measuring each first outer pin flip field value from each first curve.

3. The method as claimed in claim 1, wherein (d) comprises:
   (d1) measuring different magneto-resistance ratio responds of the magnetic tunnel junction to form different second curves under different bias current/bias voltage values; and
   (d2) measuring each second outer pin flip field value from each second curve.

4. The method as claimed in claim 1, wherein (e) comprises:
   (e11) calculating a plurality of delta bias current/bias voltage values according to the different bias current/bias voltage values;
   (e2) calculating a plurality of delta second outer pin flip field values according to the different second outer pin flip field values; and
   (e3) correlating the delta bias current/bias voltage values with the delta second outer pin flip field values to form a second equation.

5. The method as claimed in claim 1, wherein (b) is implemented under minimum applied bias voltage whose value is 40 mV.

6. The method as claimed in claim 1, wherein (d) is implemented under room temperature.

7. The method as claimed in claim 1, wherein the different temperature values are supplied by a closed loop environmental chamber.

8. The method as claimed in claim 1, selecting a reader design likely to provide stable and reliable reading performance under higher operational temperatures based on (f).

9. A method for measuring a temperature rise induced by bias current/bias voltage in a magnetic tunnel junction, the method comprising:
   (a) applying an external time-changing magnetic field to the magnetic tunnel junction;
   (b) measuring different first outer pin flip field values under different temperature values;
   (c) correlating the different temperature values with the measured first outer pin flip field values;
   (d) measuring different second outer pin flip field values under different bias current/bias voltage values;
   (e) correlating the different bias current/bias voltage values with the measured different second outer pin flip field values; and
   (f) correlating temperature values and bias current/bias voltage values according to the results produced by (c) and (e),
   wherein (e) comprises:
      (e1) calculating a plurality of delta bias current/bias voltage values according to the different bias current/bias voltage values,
      (e2) calculating a plurality of delta second outer pin flip field values according to the different second outer pin flip field values, and
      (e3) correlating the delta bias current/bias voltage values with the delta second outer pin flip field values to form a second equation.

10. The method as claimed in claim 9, wherein (b) comprises:
    (b1) measuring different magneto-resistance ratio responds of the magnetic tunnel junction to form different first curves under different temperature values; and
    (b2) measuring each first outer pin flip field value from each first curve.

11. The method as claimed in claim 9, wherein (d) comprises:
    (d1) measuring different magneto-resistance ratio responds of the magnetic tunnel junction to form different second curves under different bias current/bias voltage values; and
    (d2) measuring each second outer pin flip field value from each second curve.

12. The method as claimed in claim 9, wherein (b) is implemented under minimum applied bias voltage whose value is 40 mV.

13. The method as claimed in claim 9, wherein (d) is implemented under room temperature.

14. The method as claimed in claim 9, wherein the different temperature values are supplied by a closed loop environmental chamber.

15. The method as claimed in claim 9, selecting a reader design likely to provide stable and reliable reading performance under higher operational temperatures based on (f).

16. A method for measuring a temperature rise induced by bias current/bias voltage in a magnetic tunnel junction, the method comprising:
    (a) applying an external time-changing magnetic field to the magnetic tunnel junction;
    (b) measuring different first outer pin flip field values under different temperature values;
    (c) correlating the different temperature values with the measured first outer pin flip field values;
    (d) measuring different second outer pin flip field values under different bias current/bias voltage values;
    (e) correlating the different bias current/bias voltage values with the measured different second outer pin flip field values; and
    (f) correlating temperature values and bias current/bias voltage values according to the results produced by (c) and (e),
    wherein (b) is implemented under minimum applied bias voltage whose value is 40 mV.

17. The method as claimed in claim 16, wherein (b) comprises:

(b1) measuring different magneto-resistance ratio responds of the magnetic tunnel junction to form different first curves under different temperature values; and (b2) measuring each first outer pin flip field value from each first curve.

18. The method as claimed in claim 16, wherein (d) comprises:

(d1) measuring different magneto-resistance ratio responds of the magnetic tunnel junction to form different second curves under different bias current/bias voltage values; and (d2) measuring each second outer pin flip field value from each second curve.

19. The method as claimed in claim 16, wherein (d) is implemented under room temperature.

20. The method as claimed in claim 16, wherein the different temperature values are supplied by a closed loop environmental chamber.

* * * * *